United States Patent [19]
Iwasa

[11] Patent Number: 5,955,788
[45] Date of Patent: *Sep. 21, 1999

[54] SEMICONDUCTOR DEVICE HAVING MULTILEVEL WIRING WITH IMPROVED PLANARITY

[75] Inventor: Shinya Iwasa, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/782,945

[22] Filed: Jan. 13, 1997

[30] Foreign Application Priority Data

Jan. 12, 1996 [JP] Japan .................................. 8-004049

[51] Int. Cl.⁶ .................................................. H01L 23/48
[52] U.S. Cl. ............................................ 257/776; 257/752
[58] Field of Search ..................... 257/776, 773, 257/774, 775, 752

[56] References Cited

U.S. PATENT DOCUMENTS 5,329,162  7/1994  Nadaoka .................................. 257/776

FOREIGN PATENT DOCUMENTS 60-49649  3/1985  Japan ..................................... 257/776
62-16546  1/1987  Japan ..................................... 257/776
2212659   7/1989  United Kingdom .................... 257/776

*Primary Examiner*—Nathan Kelley
*Attorney, Agent, or Firm*—Young & Thompson

[57] ABSTRACT

A semiconductor device having metal wirings in two or more layers has a slit formed in the metal wiring which is a lower layer, and a SOG film flows into the slit while forming the SOG film. The film thickness of the SOG film formed on the metal wiring of a large area differs little from that of the SOG film formed on the metal wiring of a small area. Therefore, a grade of flatness of an interlayer insulating film disposed between the metal wirings is not deteriorated. A humidity resistant property and an electromigration resistant property are not degraded.

14 Claims, 6 Drawing Sheets

SEMICONDUCTOR DEVICE HAVING MULTILEVEL WIRING WITH IMPROVED PLANARITY

BACKGROUND OF THE INVENTION

The present invention relates to a semiconductor device having a multilevel wiring structure and, more particularly, to a semiconductor device having a Spin-on-Glass film (hereinafter referred to as an SOG film) employed as a part of an interlayer insulating film for a multilevel wiring structure.

A multilevel wiring technology reduces a wiring length and a parasitic capacitance between wirings, so that it is possible to achieve a high speed performance for a semiconductor device having a multilevel wiring structure. Furthermore, the multilevel wiring technology has an advantage in a reduction in freedom of layout designing, so that it is significantly effective for a high integration of a semiconductor element.

The multilevel wiring structure inevitably has an interlayer insulating film between lower and upper wiring lines to isolate them from each other. The desired one or ones of the metal wiring layers are connected electrically through an associated one of contact holes. The interlayer insulating film disposed between the metal wirings is flattened principally with the SOG film.

A conventional way to flatten the interlayer insulating film disposed between the multilayer metal wirings using the SOG film will be described with reference to the drawings below.

FIGS. 5(a) and 5(b) are drawings showing the flattening of the interlayer insulating film disposed between the multilevel metal wirings using the SOG film. Specifically, FIG. 5(a) is a plan view of the metal wirings of a large area used for such as a power source wiring and/or a GND wiring. FIG. 5(b) is a plan view of an array section.

FIGS. 6(a) to 6(d) are section views showing manufacturing steps, taken along the line A—A' of FIG. 5(a), and FIGS. 7(a) to 7(d) are section views showing manufacturing steps, taken along the line B—B' of FIG. 5(b).

The manufacturing steps for manufacturing the semiconductor device having the multilayer metal wirings will be described with reference to FIGS. 6(a) to 6(d) and FIGS. 7(a) to 7(d) below.

First, a metal wiring 102 is selectively formed on an insulating film 101. Then, an interlayer insulating film 103 formed of a silicon dioxide film is formed to cover the insulating film 101 and the metal wiring 102. Thereafter, to increase a grade of flatness of the interlayer insulating film disposed between the metal wirings, an SOG film 104 is coated on the entire surface of the interlayer insulating film 103 (FIG. 6(a) and FIG. 7(a)). At this time, a film thickness of the SOG film 104 formed on the metal wiring 102 is thicker as shown in FIGS. 6(a) and 7(a), as an area of the metal wiring 102 is wider. Specifically, in the region where the metal wiring 102 is formed as shown in FIG. 5(b), the SOG film 104 flows into a space between the metal wirings 102 during the formation of the SOG film 104 so that the film thickness of the portion of the SOG film 104 disposed on the metal wiring 102 is smaller. On the other hand, in case of the metal wiring 102 of a large area, there is no space for the SOG film 104 to flow into, so that the SOG film 104 is formed so as to have a larger film thickness.

Subsequently, the resultant structure is subjected to an anisotropic dry etching to leave respective parts of the SOG film 104 corresponding to surface steps of the metal wiring 102 (FIGS. 6(b) and 7(b)). In order to further flatten the uneven surface, another SOG film 105 is formed newly on the entire surface, and an anisotropic etching is performed, thereby increasing the degree of the flatness of the interlayer insulating film 103 (FIGS. 6(c) and 7(c)).

Thereafter, an interlayer insulating film 106 formed of a silicon dioxide film is formed, and contact holes 107 and metal wirings 108 are then formed (FIGS. 6(d) and 7(d)).

In this device, however, since the additional SOG film 105 is required to be formed and an anisotropic etching is performed to increase the degree of the flatness of the interlayer insulating film, the number of manufacturing steps is increased. Moreover, the dry etching is performed twice, so that the film thickness of the interlayer insulating film 103 becomes small to deteriorate the moisture resistant property thereof.

In addition, since on the metal wiring of a large area, the thicker SOG film is formed, the interlayer insulating film is not almost removed on the anisotropic dry etching. Consequently, an aspect ratio of the contact hole formed on the metal wiring of a large area is large. A reduction in step coverage of an upper wiring is produced, which is formed of i.e., aluminum disposed in the contact hole. Thus, an increase in contact hole resistance and a reduction in electromigration resistance property are produced.

SUMMARY OF THE INVENTION

It is therefore an object of the present invention is to provide a semiconductor device capable of increasing a degree of flatness of an interlayer insulating film disposed between metal wirings, which reduces the number of manufacturing steps and increases moisture resistance property, as well as electromigration resistance property.

A semiconductor device according to one aspect of the present invention comprises metal wirings formed of more than two metal layers; an SOG film; an interlayer insulating film which insulates between the metal wirings; and a contact hole which connects electrically the metal wirings, wherein a metal wiring which is a lower layer of the metal wirings comprises a slit.

The slit is formed in the vicinity of the contact hole. The interlayer insulating film is formed of a plasma oxide film. The SOG film is formed of an SiO2 series resin material.

In the semiconductor device of the present invention, when the SOG film is formed on the metal wiring, the SOG film flows into the slit formed in the metal wiring. In the event that the metal wiring has a large area, a film thickness of the SOG film formed on the metal wiring is small.

For this reason, the difference between the film thickness of the SOG film formed of the metal wiring disposed in a fine metal wiring pattern and that of the SOG film formed on the metal wiring of a large area is little.

BRIEF DESCRIPTION OF THE DRAWINGS

The above and other objects, features and advantages of the present invention will be more apparent from the following description takes in conjunction with the accompanying drawings, in which.

DETAILED DESCRIPTION OF THE PREFERRED EMBODIMENTS

Figure 1A:
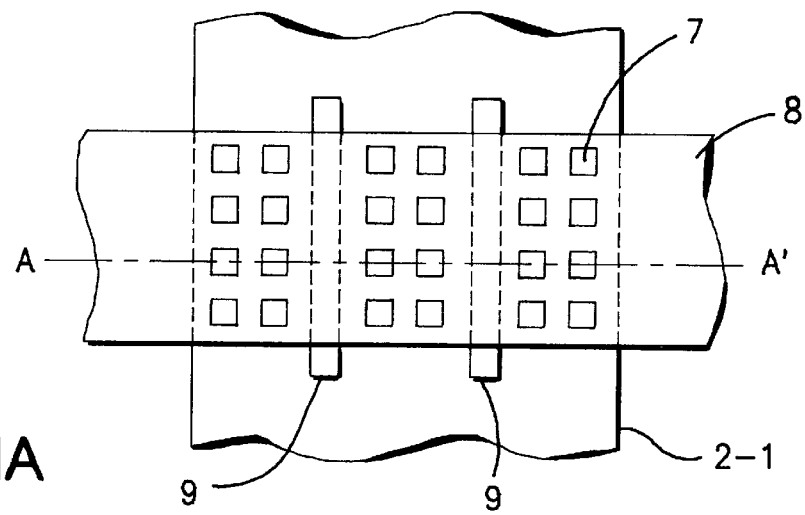
FIGS. 1(a) and 1(b) are plan views showing a part of a semiconductor device according to an embodiment of the present invention, specifically, FIG. 1(a) being a plan view of a metal wiring of a large area used in such as power source and GND wirings, and FIG. 1(b) being a plan view of an array section.
Figure 1B:
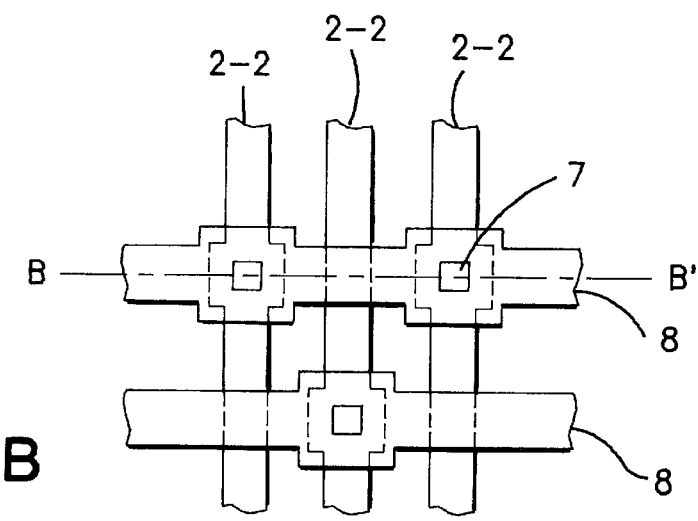
Figure 2A:
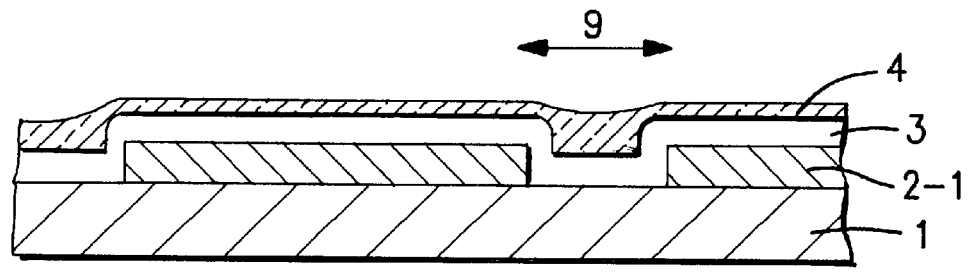
FIGS. 2(a), 2(b), and 2(c) are section views showing manufacturing steps taken along the line A—A' of FIG. 1(a)

Referring now to FIGS. 1 to 3 illustrative of an embodiment of the present invention, a conductive layer such as a metal is formed on an insulating film 1 covering a semiconductor body (not shown). This layer is then patterned to form a lower power supply line 2-1 and a plurality of lower signal lines 2-2. At this time, as shown in FIGS. 1(a) and 2(a), a plurality of slits 9 are formed simultaneously in the line 2-1 in the same direction as the line 2-1 running when a minimum space between the signal lines 2-2 shown in FIG. 1(b) is, for example 0.5 μm, each of the widths of the slits 9 is set to be range of about 0.5 μm to 1.5 μm.

Figure 3A:
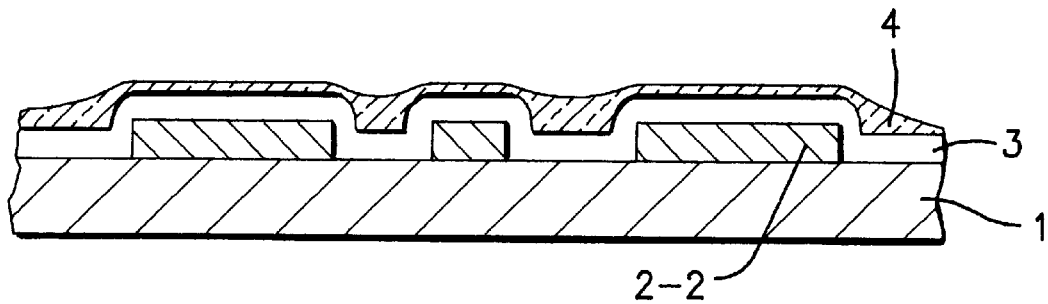
FIGS. 3(a), 3(b), and 3(c) are section views showing manufacturing steps taken along the line B—B' of FIG. 1(b)

An interlayer insulating film 3 such as an silicon oxide film of about 5000 Å in thickness is thereafter formed on the entire surface of the resultant structure by use of a plasma CVD technique. An SOG film 4 is coated such that, as shown in FIGS. 2(a) and 3(a), a concave portion of the slits 9 are buried with the SOG film 4. Then, the SOG film 4 is cured by a thermal treatment of about 400° C. By the slits 9, there is only a little difference in thickness between the part of the film 4 on the wiring lines 2-1 and the part the film 4 on the signal wiring lines 2-2. This is because a part of the SOG film 4 flows into the slit 9 to reduce the thickness of the SOG film 4 on the wiring lines 2-1.

Figure 2B:
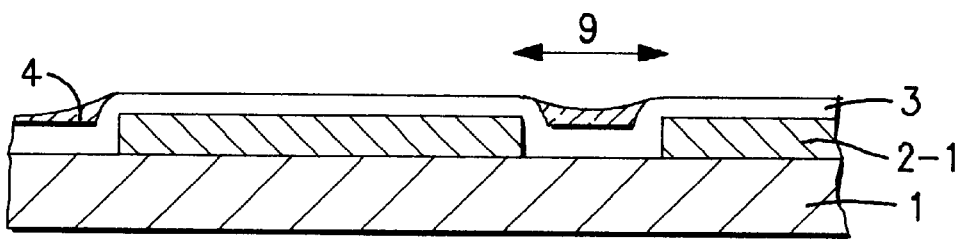
Figure 2C:
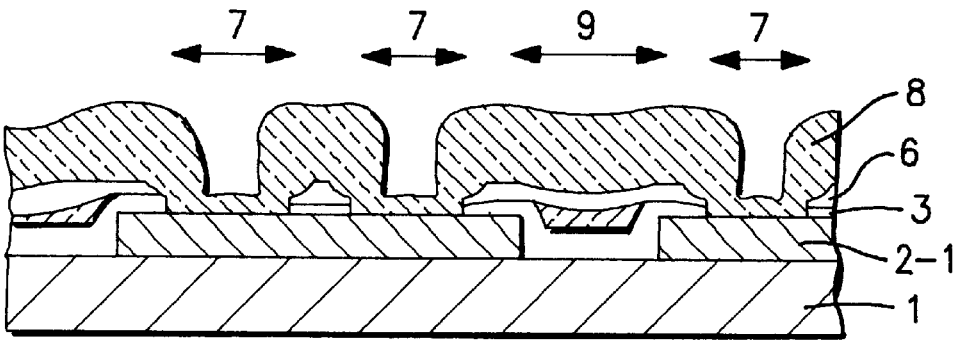
Figure 3B:
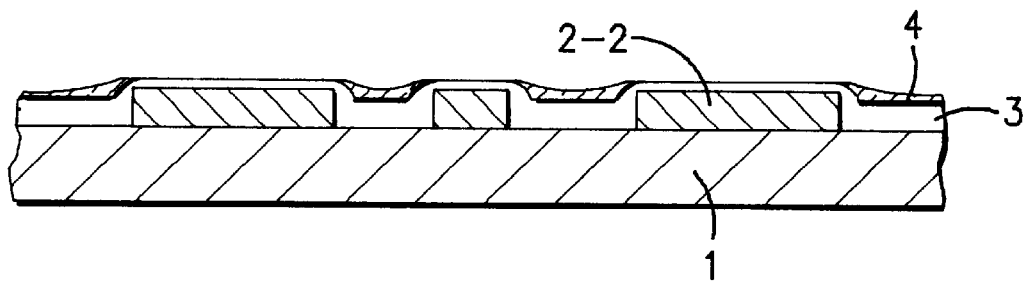
Figure 3C:
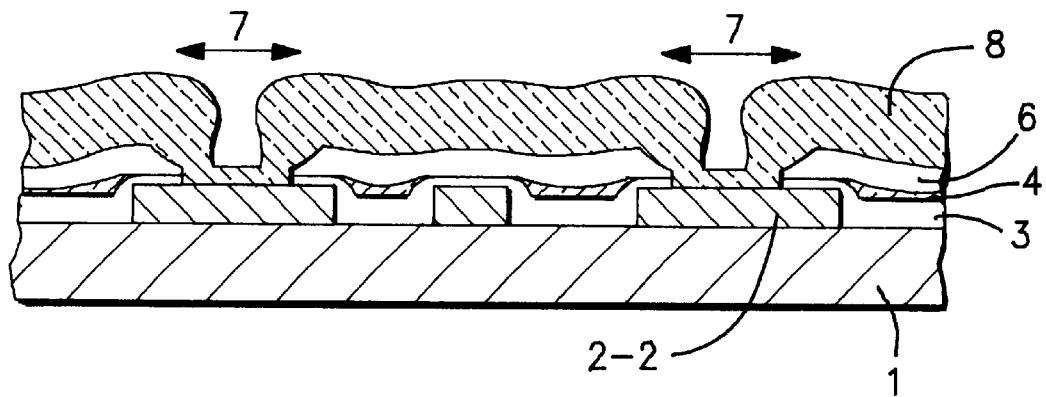
Figure 5A:
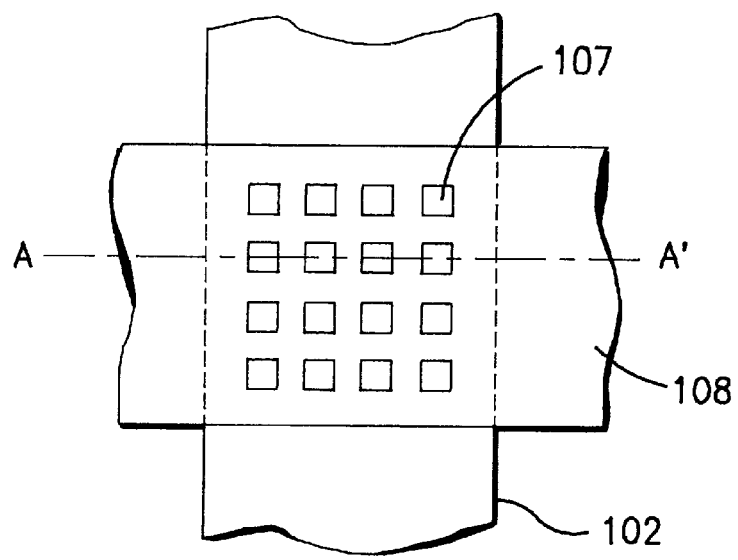
FIGS. 5(a) and 5(b) are plan views to explain flattening conventionally of an interlayer insulating film disposed between a multilevel metal wirings using an SOG film, specifically, FIG. 5(a) being a plan view of a metal wiring of a large area used for such as power source and GND wirings, and FIG. 5(b) being a plan view of an array section.
Figure 5B:
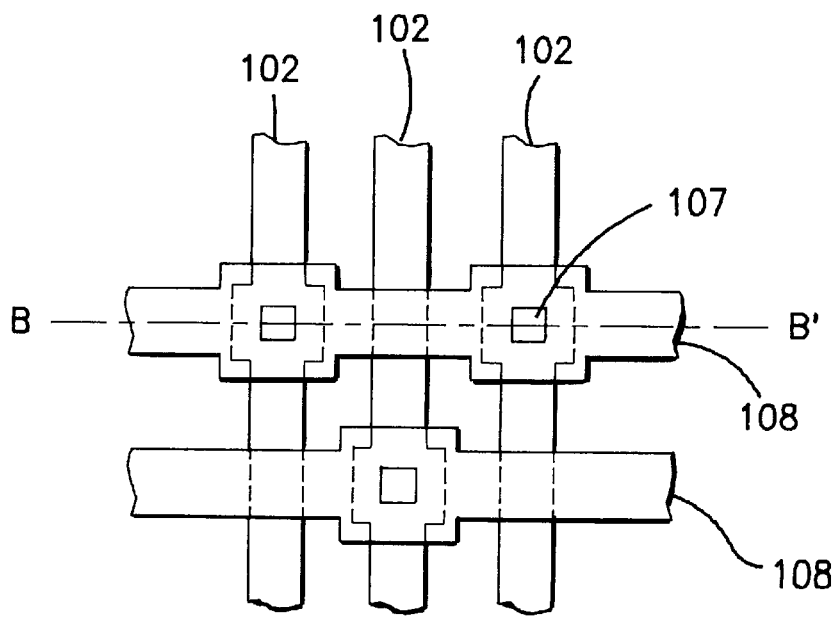
Figure 6A:
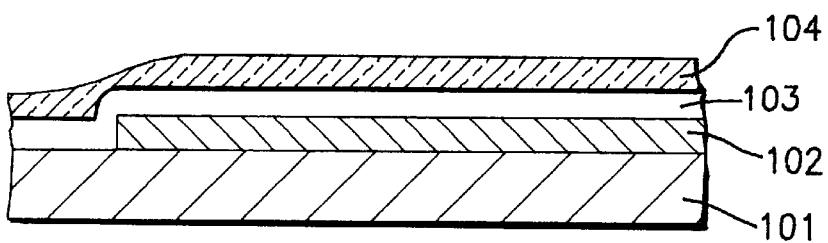
FIGS. 6(a), 6(b), 6(c) and 6(d) are section views showing manufacturing steps taken along the line A—A' of FIG. 5(a)
Figure 6B:
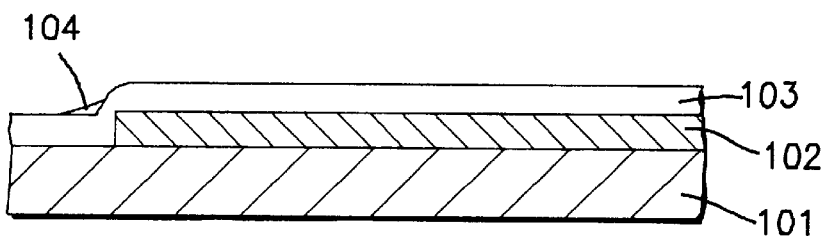
Figure 6C:
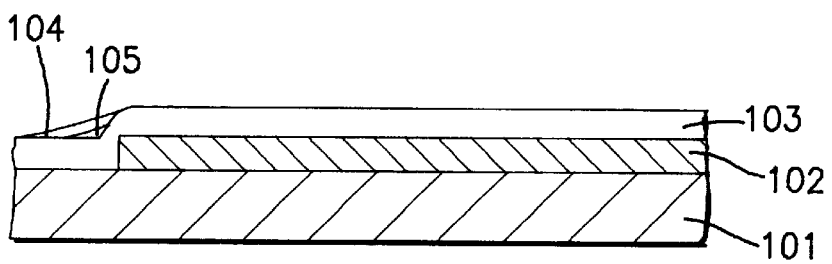
Figure 6D:
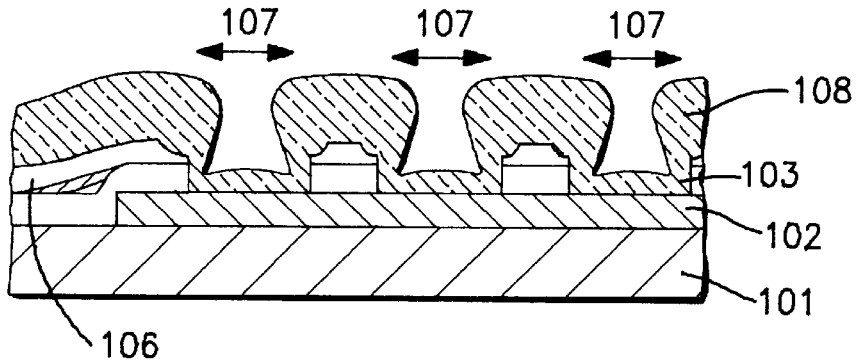
Figure 7A:
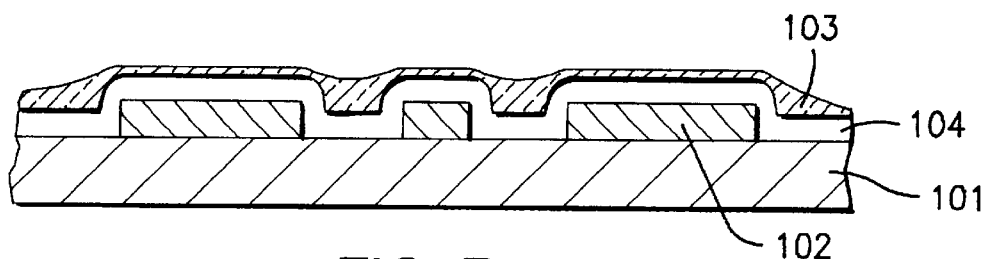
FIGS. 7(a), 7(b), 7(c) and 7(d) are section views showing manufacturing steps taken along the line B—B' of FIG. 5(b).
Figure 7B:
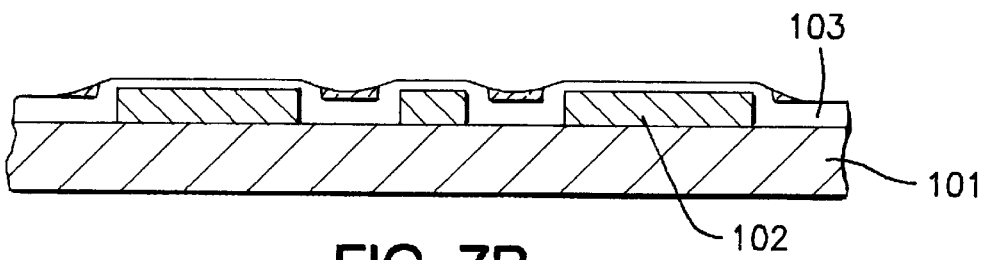
Figure 7C:
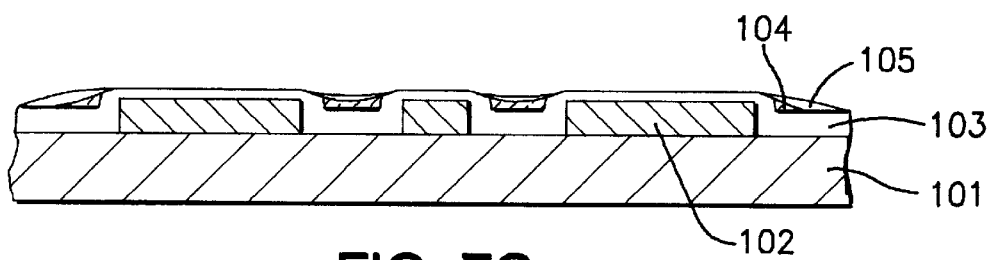
Figure 7D:
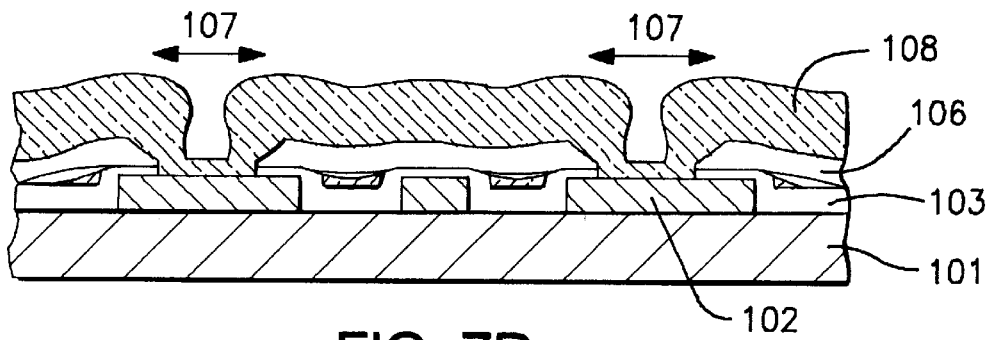

Subsequently, The SOG film 4 and the interlayer insulating film 3 covering the metal wiring 2 are partially removed by an anisotropic dry etching (FIGS. 2(b) and 3(b)) until the respective top surfaces of the wiring layers 2-1 and 2-3 is exposed. As shown in FIGS. 2(a), 2(b) and 2(c) and 3(a), 3(b) and 3(c), since there is only a little difference in thickness between the respective parts of the SOG film 4 covering the respective top surfaces of the lines 2-1 and 2-2 as described above, the surface of an interlayer insulating layer composed of the insulating film 3 and the remaining SOG film 4 is made substantially flat.

Thereafter, a new interlayer insulating film 6 formed of, for example a plasma silicon oxide film having a thickness of about 4000 Å is deposited on the entire surface. This film 6 and the film 3 is patterned to form contact holes 7. Subsequently, a conductive layer such as a metal is deposited and then patterned to form upper power supply line 8-1 and a plurality of upper signal lines 8-2.

Figure 4:
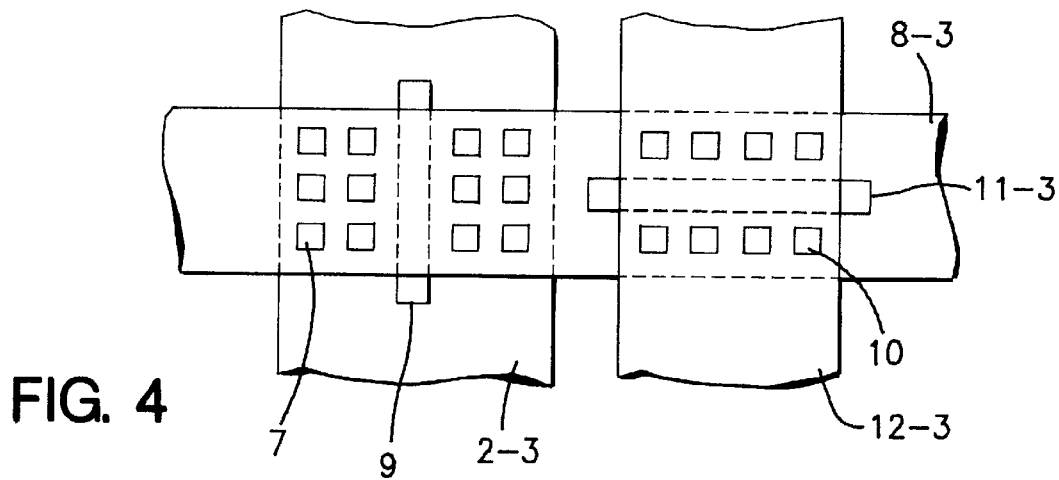
FIG. 4 is a plan view showing a part of a semiconductor device according to another embodiment of the present invention.

Turning to FIG. 4, the device illustrated therein has a three-level wiring structure, in which the same constituents as those shown in FIG. 1 are denoted by the same reference numerals to omit the further description thereof. In this device, the wiring lines 2-3, 8-3 and 12-3 are formed as a lower level a middle level and an upper level, respectively. Slits 9-3 and 11-3 are formed respectively in the wiring lines 2-3 and 8-3 in accordance with the present invention. Accordingly, the device of the three-level wiring structure has the same effects as described above.

The present invention is applicable to a device of a four- or more-level wiring structure.

As described above, according to the present invention, the difference between the film thickness of the SOG film formed on the metal wiring of a large area and that of the SOG film formed on the metal wiring of a fine pattern is small. The interlayer insulating film disposed between the metal wirings a grade of the flatness of the interlayer insulating between the metal wirings can be increased.

However the formation of the SOG film and the removal of the SOG film on the metal wiring by the anisotropic dry etching are only once performed, respectively, a sufficient flatness can be achieved. Therefore, the number of manufacturing steps for the formation of the interlayer insulating film between the metal wirings can be reduced.

It is possible to form the interlayer insulating film having always a constant film thickness, so that humidity resistant property of the interlayer insulating film can be increased.

Since it is possible to form the interlayer insulating film having a constant film thickness, the formation of the contact holes having the same aspect ratio is possible. Thus, a step coverage of the metal wiring formed of aluminum as an upper wiring can be maintained constant. Therefore, an electromigration resistant property in the contact holes can be increased.

It is apparent that the present invention is not limited to the above embodiments but may be modified and changed without departing from the scope and spirit of the invention.

What is claimed is:

1. A semiconductor device comprising an insulating layer covering a semiconductor body, a first elongated wiring line selectively formed on said insulating layer, at least one slit selectively formed in said first wiring line, an interlayer insulating film covering said first wiring line and said insulating layer and filling said slit, at least one contact hole selectively formed in said interlayer insulating film to expose a part of said first wiring line adjacent said at least one slit, a second wiring line selectively formed on said interlayer insulating film crossing said first wiring line and passing over said at least one slit and making an electrical contact with said part of said first wiring line through said at least one contact hole, a third wiring line selectively formed on said insulating layer and being relatively narrower than said first wiring line, said third wiring line being free of slits, and a fourth wiring line selectively formed on said interlayer insulating film crossing said third wiring line.

2. The device as claimed in claim 1, wherein said slit is formed in the same direction as said first wiring layer and has a length that is larger than the width of said second wiring layer.

3. The device as claimed in claim 2, wherein said at least one contact hole is positioned at a portion of said first wiring line between said slit and an outer peripheral side of said first wiring line.

4. The device as claimed in claim 3, wherein said interlayer insulating film includes a spin-on-glass layer.

5. A semiconductor device comprising an insulating layer, a first wiring line selectively formed on said insulating layer and running in a first direction, a first slit selectively formed in said first wiring line in said first direction, said first wiring line thereby having a first area sandwiched between said first slit and a first outer peripheral side of said first wiring line, a plurality of first contact holes selectively formed in an interlayer insulating film overlying said first area of said first wiring line to expose respective parts of said first area of said first wiring line, a second wiring line selectively formed on said interlayer insulating film and running in a second direction perpendicular to said first direction to cross over said first slit while making an electrical contact with each of said respective parts of said first area of said first wiring line through said first contact holes, a third wiring line selectively formed on said insulating layer and being relatively narrower than said first wiring line, said third wiring line being free of slits, and a fourth wiring line selectively formed on said interlayer insulating film crossing said third wiring line.

6. The device as claimed in claim 5, further comprising a second slit selectively formed in said first wiring line parallel to said first slit, said first wiring line thereby further having a second area sandwiched between said first and second slits, and a plurality of second contact holes selectively formed in said interlayer insulating film over said second area of said first wiring line to expose respective parts of said second area of said first wiring line, said second wiring line further crossing over said second area and making an electrical contact with each of said respective parts of said second area of said first wiring line through said second contact holes.

7. The device as claimed in claim 6, wherein said first wiring line further has a third area sandwiched between said second slit and a second outer peripheral side of said first wiring line, and said device further comprises a plurality of third contact holes selectively formed in said interlayer insulating film over said third area of said first wiring line to expose respective parts of said third area of said first wiring line, said second wiring line further making an electrical contact with each of said respective parts of said third area of said first wiring line through said plurality of third contact holes.

8. A semiconductor device comprising an insulating layer, a first wiring line selectively formed on said insulating layer, a first slit selectively formed in said first wiring line, a first interlayer insulating film covering said insulating layer and said first wiring line and filling said first slit, a first contact hole selectively formed in said first interlayer insulating film to expose a first part of said first wiring line, a second wiring line selectively formed on said first interlayer insulating film perpendicular to said first wiring line and crossing over said first slit and making an electrical contact with said first part of said first wiring line through said first contact hole, a second slit selectively formed in said second wiring line apart from a superposed portion of said first and second wiring lines, a second interlayer insulating film covering said first interlayer insulating film and said first and second wiring lines and filling said second slit, a second contact hole selectively formed in said second interlayer insulating film to expose a second part of said second wiring line, a third wiring line selectively formed on said second interlayer insulating film perpendicular to said second wiring line and crossing over said second slit and making an electrical contact with said second part of said second wiring line through said second contact hole, a fourth wiring line selectively formed on said insulating layer and being relatively narrower than said first wiring line, said fourth wiring line being free of slits, and a fifth wiring line selectively formed on said first interlayer insulating film crossing said fourth wiring line.

9. The device as claimed in claim 1, wherein said third and fourth wiring lines are electrically connected via at least one further contact hole selectively formed in said interlayer insulating film.

10. The device as claimed in claim 5, wherein said third and fourth wiring lines are electrically connected via at least one further contact hole selectively formed in said interlayer insulating film.

11. The device as claimed in claim 8, wherein said fourth and fifth wiring lines are electrically connected via at least one further contact hole selectively formed in said first interlayer insulating film.

12. The device as claimed in claim 1, further comprising a plurality of said third wiring lines, and wherein said at least one slit has a width at least about equal to a spacing between adjacent ones of said plurality of third wiring lines.

13. The device as claimed in claim 6, further comprising a plurality of said third wiring lines, and wherein said first and second slits have a width at least about equal to a spacing between adjacent ones of said plurality of third wiring lines.

14. The device as claimed in claim 8, further comprising a plurality of said fourth wiring lines, and wherein said first and second slits have a width at least about equal to a spacing between adjacent ones of said plurality of fourth wiring lines.

* * * * *